United States Patent
Okumura et al.

(10) Patent No.: US 9,004,217 B2
(45) Date of Patent: Apr. 14, 2015

(54) ELECTRIC WORK VEHICLE

(75) Inventors: Shinya Okumura, Tsuchiura (JP);
Mitsugu Ojima, Tsuchiura (JP);
Yasunori Ota, Tsuchiura (JP);
Toshihiko Ishida, Tsuchiura (JP);
Takenori Hiroki, Tsuchiura (JP)

(73) Assignee: Hitachi Construction Machinery Co., Ltd., Tokyo (JP)

(*) Notice: Subject to any disclaimer, the term of this patent is extended or adjusted under 35 U.S.C. 154(b) by 275 days.

(21) Appl. No.: 13/698,891

(22) PCT Filed: Jul. 21, 2011

(86) PCT No.: PCT/JP2011/066588
§ 371 (c)(1),
(2), (4) Date: Nov. 19, 2012

(87) PCT Pub. No.: WO2012/011530
PCT Pub. Date: Jan. 26, 2012

(65) Prior Publication Data
US 2013/0108404 A1    May 2, 2013

(30) Foreign Application Priority Data
Jul. 22, 2010    (JP) ................................. 2010-164991

(51) Int. Cl.
*B60K 1/00* (2006.01)
*E02F 9/08* (2006.01)
*E02F 9/20* (2006.01)

(52) U.S. Cl.
CPC ............... *E02F 9/08* (2013.01); *B60L 2200/40* (2013.01); *B60L 2210/40* (2013.01); *B60L 2270/145* (2013.01); *E02F 9/0858* (2013.01); *E02F 9/20* (2013.01); *E02F 9/2025* (2013.01); *E02F 9/207* (2013.01); *H01L 2924/00* (2013.01); *H01L 2924/0002* (2013.01); *Y02T 10/7241* (2013.01)

(58) Field of Classification Search
USPC .......... 180/291, 65.31, 68.1, 68.2, 68.4, 68.6; 903/903, 907, 951, 952
See application file for complete search history.

(56) References Cited

U.S. PATENT DOCUMENTS

| | | | |
|---|---|---|---|
| 8,186,156 B2 * | 5/2012 | Kamiya et al. ................. | 60/420 |
| 8,403,099 B2 * | 3/2013 | Yokota .......................... | 180/309 |
| 2002/0104239 A1 | 8/2002 | Naruse et al. | |
| 2004/0098983 A1 * | 5/2004 | Naruse et al. .................. | 60/428 |
| 2009/0199553 A1 * | 8/2009 | Nishimura et al. ............. | 60/486 |
| 2013/0134807 A1 * | 5/2013 | Murata et al. ................... | 310/52 |
| 2013/0134840 A1 * | 5/2013 | Murata et al. ................ | 310/67 R |
| 2014/0000975 A1 * | 1/2014 | Ueda ............................ | 180/291 |

FOREIGN PATENT DOCUMENTS

| | | |
|---|---|---|
| JP | 2002-227241 A | 8/2002 |
| JP | 2004-360216 A | 12/2004 |
| WO | WO 2008/015798 A1 | 2/2008 |

OTHER PUBLICATIONS

International Search Report dated Oct. 25, 2011 with English translation (four (4) pages).

* cited by examiner

*Primary Examiner* — Faye M. Fleming
(74) *Attorney, Agent, or Firm* — Crowell & Moring LLP

(57) ABSTRACT

An electric work vehicle is provided in which the length of a high-tension cable connecting an electric motor included in a slewing motor with an inverter for controlling the electric motor can be set to be comparatively short. A region on a main frame is divided into three regions consisting of a center region, a first side region, and a second side region, via a first vertical rib and a second vertical rib. A slewing hydraulic motor and a slew assist electric motor, which constitute the slewing motor, are disposed in the center region, and an inverter for controlling the slew assist electric motor is disposed in a position near the second vertical rib in a second tool chamber provided in the second side region.

10 Claims, 5 Drawing Sheets

ELECTRIC WORK VEHICLE

TECHNICAL FIELD

The present invention relates to an electric work vehicle such as a hydraulic excavator in which a slewing motor for slewing an upper structure includes an electric motor.

BACKGROUND ART

As a background-art technique of this type, there is a technique disclosed in Patent Literature 1. The background-art technique is made up of a hydraulic excavator. The hydraulic excavator has an undercarriage, an upper structure which is disposed on the undercarriage, and a work machine, that is, a work device which is attached to the upper structure so as to be rotatable in an up/down direction. In addition, the hydraulic excavator has an operator's cab in the front of the upper structure, a counter weight in the rear of the same, and an engine room between the operator's cab and the counter weight, that is, in front of the counterweight. An engine, a hydraulic pump, a cooling unit consisting of a plurality of heat exchangers, etc. are disposed in the engine room.

In addition, according to the background-art technique, a first vertical rib and a second vertical rib are provided on a main frame of the upper structure so as to extend in parallel with each other in a front/rear direction. The region on the main frame is divided into three regions by means of the first vertical rib and the second vertical rib. That is, the region on the main frame is divided into three regions consisting of a center region which is formed between the first vertical rib and the second vertical rib, a first side region which is formed on one side of the first vertical rib so as to be located opposite to the second vertical rib and in which the operator's cab etc. are disposed, and a second side region which is formed on the other side of the second vertical rib so as to be located opposite to the first vertical rib and in which a fuel tank etc. are disposed.

According to the background-art technique, a slewing motor for slewing the upper structure is disposed in the center region of the aforementioned three regions on the main frame, and constituted by a slewing electric motor, that is, an electric motor. A control device including an inverter for controlling the slewing electric motor and an electric storage device for storing electric power for driving the slewing electric motor are provided in the engine room and disposed in an upstream position of the cooling unit with respect to the flow of intake air introduced into the engine room.

CITATION LIST

Patent Literature

Patent Literature 1: WO 2008/015798

SUMMARY OF INVENTION

Technical Problem

According to the aforementioned background-art technique, the slewing electric motor is disposed in the center region of the three regions on the main frame and the inverter for controlling the slewing electric motor is disposed in the engine room located at the rear of the aforementioned center region. Therefore, a high-tension cable which is not shown in Patent Literature 1 but which connects the slewing electric motor with the inverter is apt to be elongated. Here, though not shown in Patent Literature 1, various sensors etc. are generally disposed on the main frame of the hydraulic excavator, and control signal lines are connected to the sensors etc. respectively. Therefore, according to the background-art technique disclosed in Patent Literature 1, the long high-tension cable connecting the slewing electric motor with the inverter may approach or cross the aforementioned control signal lines. When the aforementioned high-tension cable approaches or crosses the aforementioned control signal lines in this manner, there is a fear that the control signal lines may receive noise from the high-tension cable. When the control signal lines receive noise in this manner, the accuracy of control processed through the control signal lines may be lowered.

In addition, when the high-tension cable connecting the slewing electric motor with the inverter is elongated as described above, the installation expense of the high-tension cable increases to increase the manufacturing cost of the hydraulic excavator.

The present invention has been accomplished in consideration of the aforementioned actual situation in the background art. An object of the invention is to provide an electric work vehicle in which the length of a high-tension cable connecting an electric motor included in a slewing motor with an inverter for controlling the electric motor can be set to be comparatively short.

Solution to Problem

In order to achieve the object, according to the present invention, there is provided an electric work vehicle including: an upper structure; a work device which is attached to the upper structure; a counter weight which is disposed at the rear of the upper structure; an engine room which is disposed in front of the counterweight; a first vertical rib and a second vertical rib which are provided on the main frame so as to extend in parallel with each other in a front/rear direction so that a region on the main frame is divided into three regions consisting of a center region which is formed between the first vertical rib and the second vertical rib, a first side region which is located on an opposite side to the second vertical rib with interposition of the first vertical rib, and a second side region which is located on an opposite side to the first vertical rib with interposition of the second vertical rib; a slewing motor which slews the upper structure, which is disposed in the center region of the three regions on the main frame and which includes an electric motor; and an inverter for controlling the electric motor; characterized in that: the inverter is disposed on the main frame and in front of the engine room so as to be located in the first side region or the second side region and near the electric motor included in the slewing motor.

In the invention configured thus, the inverter for controlling the electric motor included in the slewing motor is disposed in the first side region or the second side region which is located near the electric motor included in the slewing motor disposed in the center region of the three regions on the main frame. Accordingly, the length of a high-tension cable connecting the electric motor with the inverter can be set to be comparatively short. In this manner, the aforementioned high-tension cable can be prevented from approaching or crossing control signal lines connected to various sensors etc. disposed on the main frame, so that the probability that the various control signal lines may receive noise from the high-tension cable can be reduced. In addition, since the length of the high-tension cable can be set to be comparatively short, it is possible to reduce the installation expense of the high-tension cable.

In addition, all the three regions on the main frame except the center region, that is, the first side region and the second side region are regions covered with an exterior cover from above. Accordingly, due to the exterior cover, the inverter can be protected from rainfall, wind and snow, solar radiation, etc.

In addition, the present invention in the aforementioned configuration may be characterized in that: the slewing motor includes a slewing hydraulic motor and a slew assist electric motor provided additionally to the slewing hydraulic motor, and the electric motor included in the slewing motor is the slew assist electric motor.

In the invention configured thus, the upper structure can be slewed by the slewing hydraulic motor and the slew assist electric motor. Accordingly, the capacity of the slew hydraulic motor can be set to be small.

In addition, the present invention in the aforementioned configuration may be characterized in that: a vehicle body controller which is disposed in the first side region or the second side region and which controls slewing of the upper structure, running of the undercarriage and driving of the work device is provided, and the inverter is disposed in the region where the vehicle body controller is provided.

According to the invention configured thus, the length of a control signal line connecting the vehicle body controller with the inverter can be set to be comparatively short. Accordingly, it is possible to reduce the probability that the control signal line may receive noise from the high-tension cable connecting the electric motor included in the slewing motor with the inverter or from the electric motor.

In addition, the present invention in the aforementioned configuration may be characterized in that: an operator's cab is provided in the upper structure and in front of the engine room, and the vehicle body controller is disposed in the operator's cab.

According to the invention configured thus, due to the operator's cab, the vehicle body controller can be protected from rainfall, wind and snow, solar radiation, etc. Further, since the operator's cab usually forms a vibration isolating structure, it is possible to secure vibration isolation in the vehicle body controller. Accordingly, it is possible to achieve highly accurate inverter control which is performed through a control signal line connected to the controller.

In addition, the present invention in the aforementioned configuration may be characterized in that: an electric storage device which supplies driving power to the inverter is disposed in the region where the inverter is disposed.

According to the invention configured thus, the length of a high-tension cable connecting the inverter with the electric storage device can be set to be comparatively short. It is therefore possible to prevent the high-tension cable connecting the inverter with the electric storage device from approaching or crossing control signal lines connected to various sensors etc. disposed on the main frame so that it is possible to reduce the probability that the control signal lines may receive noise from the high-tension cable connecting the inverter with the electric storage device. Further, since the length of the high-tension cable connecting the inverter with the electric storage device can be set to be comparatively short, it is possible to reduce the installation expense of the high-tension cable.

In addition, the present invention in the aforementioned configuration may be characterized in that: a cooling unit which includes a plurality of heat exchangers is provided in the engine room, and an electric storage device which supplies driving power to the inverter is disposed in the engine room and in an upstream position of the cooling unit with respect to a flow of intake air introduced into the engine room.

According to the invention configured thus, it is possible to keep the electric storage device at a comparatively low temperature so that it is possible to prevent the electric storage device from deteriorating in performance and from malfunctioning.

Advantageous Effects of Invention

According to the invention, there is provided an electric work vehicle in which a region on a main frame of an upper structure is divided into three regions consisting of a center region, a first side region and a second side region by means of a first vertical rib and a second vertical rib, and a slewing motor including an electric motor for slewing the upper structure is disposed in the center region, and in which an inverter for controlling the electric motor included in the slewing motor is disposed on the main frame and in front of an engine room so as to be located in the first side region or the second side region and near the electric motor included in the slewing motor. Accordingly, the length of a high-tension cable connecting the electric motor included in the slewing motor with the inverter for controlling the electric motor can be set to be comparatively short. In this manner, according to the invention, the possibility that various control signal lines disposed on the main frame may receive noise from the high-tension cable can be reduced so that the accuracy of control performed through the various control signal lines can be made higher than that in the background art. In addition, since the length of the high-tension cable connecting the electric motor with the inverter can be set to be comparatively short, it is possible to reduce the installation expense of the high-tension cable so that it is possible to reduce the manufacturing cost of the electric work vehicle more than that in the background art.

Further, according to the invention, due to an exterior cover which covers the first side region or the second side region from above, the inverter can be protected from rainfall, wind and snow, solar radiation, etc. Thus, it is possible to achieve an electric work vehicle which is superior in the control accuracy of the electric motor included in the slewing motor.

DESCRIPTION OF EMBODIMENTS

Embodiments of an electric work vehicle according to the invention will be described below with reference to the drawings.

Figure 1:
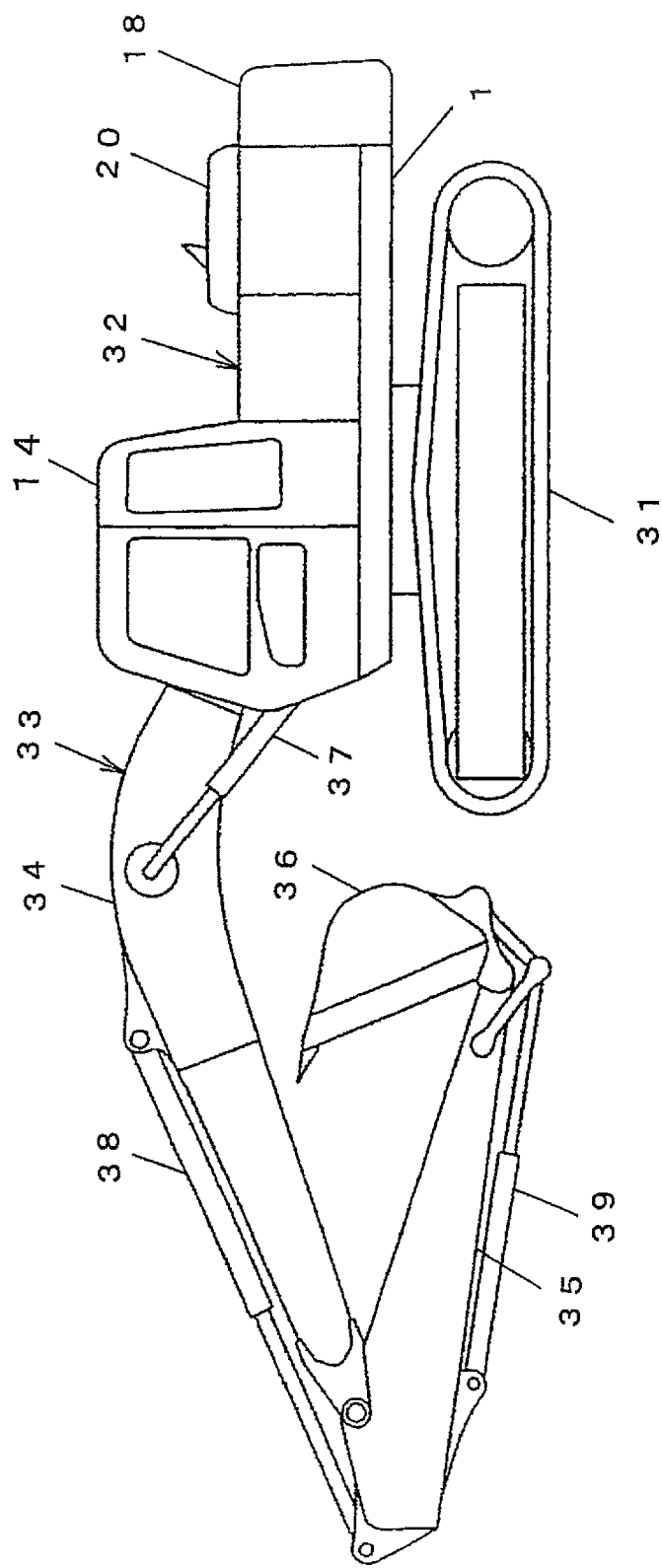
FIG. 1 A side view showing a crawler type hydraulic excavator arranged as a first embodiment of an electric work vehicle according to the invention.
Figure 2:
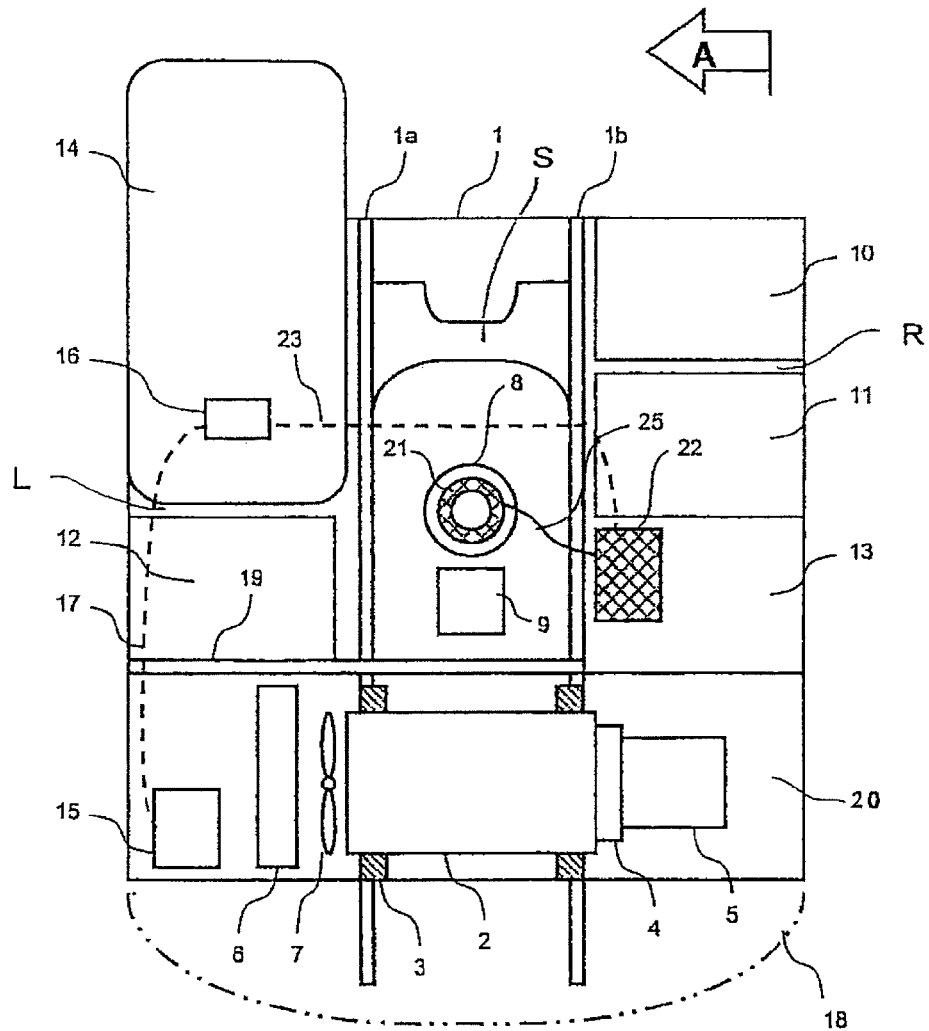
FIG. 2 A plan view showing the layout of devices on an upper structure provided in the crawler type hydraulic excavator in FIG. 1.
Figure 3:
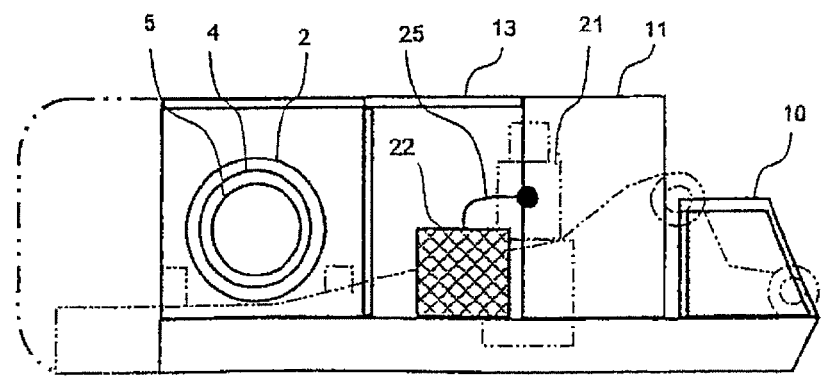
FIG. 3 A sectional view in the direction of the arrow A in FIG. 2.

FIG. 1 is a side view showing a crawler type hydraulic excavator arranged as a first embodiment of an electric work vehicle according to the invention. FIG. 2 is a plan view showing the layout of devices on an upper structure provided in the crawler type hydraulic excavator in FIG. 1. FIG. 3 is a sectional view in the direction of the arrow A in FIG. 2.

The first embodiment which relates to an electric work vehicle according to the invention is a crawler type hydraulic excavator, as shown in FIG. 1. The hydraulic excavator has an undercarriage 31, an upper structure 32 disposed on the undercarriage 31, and a work device 33 attached to the upper structure 32. The work device 33 includes a boom 34 attached to the upper structure 32 so as to be rotatable in an up/down direction, an arm 35 attached to a front end of the boom 34 so as to be rotatable in the up/down direction, and a bucket 36 attached to a front end of the arm 35 so as to be rotatable in the up/down direction. In addition, the work device 33 includes a boom cylinder 37 for operating the boom 34, an arm cylinder 38 for operating the arm 35, and a bucket cylinder 39 for operating the bucket 36. An operator's cab 14 is disposed in the front of the upper structure 32 on a main frame 1, and a counter weight 18 is disposed in the rear of the upper structure 32 on the main frame 1. An engine room 20 is disposed between the operator's cab 14 and the counter weight 18.

As shown in FIG. 2, a first vertical rib 1a and a second vertical rib 1b arranged in parallel with each other in a front/rear direction are provided on the main frame 1, and a region on the main frame 1 located in front of the engine room 20 is divided into three regions. That is, the region on the main frame 1 is formed into three regions consisting of a center region S formed between the first vertical rib 1a and the second vertical rib 1b, a first side region L located on an opposite side to the second vertical rib 1b with the interposition of the first vertical rib 1a, and a second side region R located on an opposite side to the first vertical rib 1a with the interposition of the second vertical rib 1b. Though not shown, an exterior cover is provided above the first side region L and the second side region R of the three regions, but the exterior cover is not provided above the center region S to which the work device 33 is attached. Though not shown, a cover is also provided above the engine room 20.

A slewing motor for slewing the upper structure 32 is disposed in the center region S. The slewing motor includes an electric motor. For example, the slewing motor is constituted by a slewing hydraulic motor 8 and a slew assist electric motor 21 provided additionally to the slewing hydraulic motor 8. The aforementioned electric motor included in the slewing motor is, for example, the aforementioned slew assist electric motor 21. In addition, a control valve 9 is disposed in the center region S.

The aforementioned operator's cab 14 and a hydraulic oil tank 12 are disposed in the first side region L. In the second side region R, a first tool chamber 10 is provided and located in a front side, a second tool chamber 13 is provided and located in a rear side, and a fuel tank 11 is disposed between the first tool chamber 10 and the second tool chamber 13. As shown in FIG. 3, the first tool chamber 10 forms a step with which an operator can climb the exterior cover. To this end, the volume of the second tool chamber 13 is set to be larger than the volume of the first tool chamber 10.

In the engine room 20 which is provided to be separated from the aforementioned center region S and the aforementioned first side region L by a partition 19 and which is located in front of the counter weight 18, an engine 2 is mounted on the first vertical rib 1a and the second vertical rib 1b through a vibration isolation rubber 3. A hydraulic pump 5 which is driven by the engine 2 is attached to the engine 2 through a power transmission portion 4. Pressure oil ejected from the hydraulic pump 5 is supplied through the control valve 9 either to various hydraulic cylinders such as the boom cylinder 37, the arm cylinder 38 and the bucket cylinder 39 for driving the aforementioned work device 33, or to the slewing hydraulic motor 8 for slewing the upper structure 32 or a not-shown drive motor for driving the undercarriage 31 to run so that the upper structure 32 or the undercarriage 31 can be driven together with the work device 33 by the operation of a corresponding hydraulic actuator supplied with the pressure oil. Thus, various works including a soil excavation work can be preformed.

A fan 7 for generating intake air is disposed in the engine room 20 so as to be located in an upstream position of the engine 2 with respect to the flow of the intake air introduced into the engine room 20. A cooling unit 6 constituted by a plurality of heat exchangers including radiators, oil coolers and inter coolers is disposed in an upstream position of the fan 7.

In addition, the hydraulic excavator according to the first embodiment has a vehicle controller 16 for controlling the slewing of the upper structure 32, the travelling of the undercarriage 31 and the driving of the work device 33 individually. The vehicle body controller 16 is, for example, disposed in the operator's cab 14 positioned in the front of the first side region L.

Further, the hydraulic excavator according to the first embodiment has an inverter 22 for controlling the slew assist electric motor 21. The inverter 22 is disposed in front of the engine room 20 on the main frame 1 and provided in a position near the slew assist electric motor 21 in the first side region L or the second side region R. For example, this inverter 22 is disposed in the second side region R and provided in a position near the second vertical rib 1b (i.e. close to the slew assist electric motor 21) in the second tool chamber 13 which has a comparatively large volume. The inverter 22 and the slew assist electric motor 21 are connected with each other by a high-tension cable 25. In addition, the inverter 22 and the aforementioned vehicle body controller 16 for controlling the inverter 22 are connected with each other through a control signal line 23. The control signal line 23 is wired to bypass the slew assist electric motor 21 and the high-tension cable 25 in order to avoid access to the slew assist electric motor 21 and the high-tension cable 25. For example, as shown in FIGS. 2 and 3, the high-tension cable 25 is wired to climb over the second vertical rib 1b while the control signal line 23 is wired to pass through a hole provided in the second vertical rib 1b. Alternatively, a hole through which the high-tension cable 25 is inserted may be provided in the second vertical rib 1b while the control signal line 23 is wired to climb over the second vertical rib 1b.

In addition, the hydraulic excavator according to the first embodiment has an electric storage device 15 which supplies electric power for activating the vehicle body controller 16. The electric storage device 15 is disposed in an upstream position of the cooling unit 6 in the engine room 20. The electric storage device 15 and the vehicle body controller 16 are connected with each other by a control signal line 17.

In the hydraulic excavator according to the first embodiment configured thus, the upper structure 32 slews due to the cooperation between a slewing force applied by the slewing hydraulic motor 8 and a slewing force applied by the slew assist electric motor 21. On the other hand, when the upper structure 32 is decelerated, the slew assist electric motor 21 serves as an electric generator. Electric power generated by the slew assist electric motor 21 is stored in a not-shown electric storage device. When the upper structure 32 slews as described above, the slew assist electric motor 21 is driven by the electric power from the not-shown electric storage device.

In the hydraulic excavator according to the first embodiment configured thus, the slew assist electric motor 21 is included in the slewing motor disposed in the center region S of the three regions on the main frame 1. The inverter 22 for controlling the slew assist electric motor 21 is disposed in a position near the second vertical rib 1b (i.e. close to the slew assist electric motor 21) in the second tool chamber 13 in the second side region R. Accordingly, the length of the high-tension cable 25 connecting the slew assist electric motor 21 with the inverter 22 can be set to be comparatively short.

In this manner, according to the first embodiment, the high-tension cable 25 can be prevented from approaching or crossing the control signal line 23 disposed on the mainframe 1 and control signal lines connected to not-shown various sensors and so on, so that the probability that the various control signal lines may receive noise from the slew assist electric motor 21 and the high-tension cable 25 can be reduced. Accordingly, it is possible to enhance the accuracy of control performed through the various control signal lines. In addition, since the length of the high-tension cable 25 connecting the slew assist electric motor 21 with the inverter 22 can be set to be comparatively short according to the first embodiment, it is possible to reduce the installation expense of the high-tension cable 25 so that it is possible to reduce the manufacturing cost of the hydraulic excavator.

In addition, the second side region R on the main frame 1 is a region which is covered with a not-shown exterior cover. Accordingly, according to the first embodiment, due to the exterior cover, the inverter 22 received in the second tool chamber 13 can be protected from rainfall, wind and snow, solar radiation, etc. Thus, the performance of the inverter 22 can be kept stable over a long time. It is therefore possible to achieve a hydraulic excavator which is superior in the control accuracy of the slew assist electric motor 21 included in the slewing motor.

In addition, according to the first embodiment, the upper structure 32 can be slewed by the slewing hydraulic motor 8 and the slew assist electric motor 21. Thus, the volume of the slewing hydraulic motor 8 can be set to be small.

In addition, according to the first embodiment, due to the operator's cab 14, the vehicle body controller 16 can be protected from rainfall, wind and snow, solar radiation, etc. In addition, since the operator's cab 14 usually forms a vibration isolating structure, it is also possible to secure vibration isolation in the vehicle body controller 16. Accordingly, it is possible to achieve highly accurate control performed on the inverter 22 through the control signal line 23 connected to the vehicle body controller 16. Thus, it is possible to obtain a highly reliable hydraulic excavator.

Figure 4:
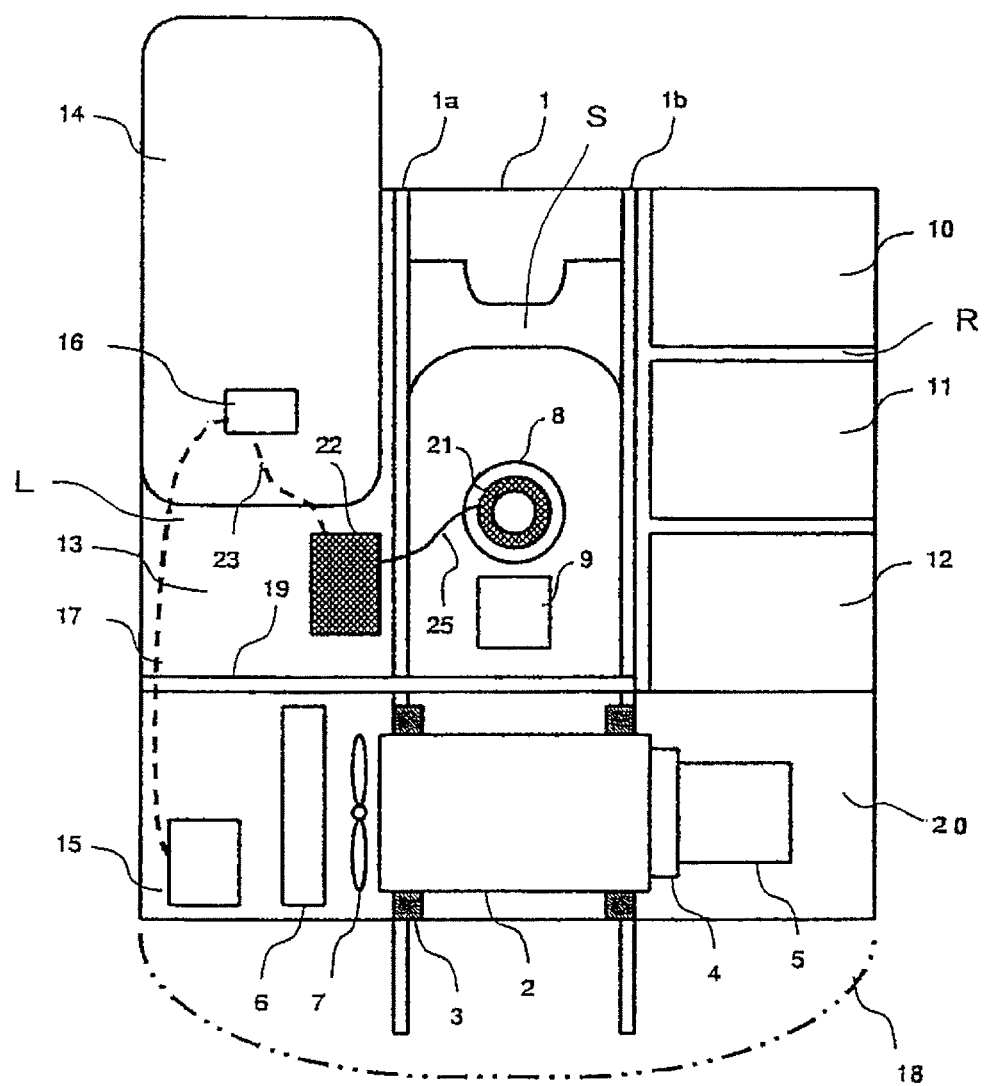
FIG. 4 A plan view showing the layout of devices on an upper structure provided in a second embodiment of the invention.

FIG. 4 is a plan view showing the layout of devices on an upper structure provided in a second embodiment of the invention. An electric work vehicle provided in the second embodiment may be also, for example, a hydraulic excavator equivalent to the crawler type hydraulic excavator shown in FIG. 1.

As shown in FIG. 4, in the hydraulic excavator according to the second embodiment, the inverter 22 for controlling the slew assist electric motor 21 is disposed in the same region as the region where the vehicle body controller 16 is provided. That is, the vehicle body controller 16 is disposed in the operator's cab 14 disposed in the first side region L, and the inverter 22 is disposed in a position near the first vertical rib 1a in the second tool chamber 13 provided in the same first side region L. For example, the high-tension cable 25 connecting the inverter 22 with the slew assist electric motor 21 is disposed to climb over the first vertical rib 1a. The vehicle body controller 16 and the inverter 22 are connected with each other by the control signal line 23. The hydraulic oil tank 12 is disposed at the rear of the fuel tank 11 in the second side region R. The other configuration is equivalent to that in the aforementioned first embodiment.

In the hydraulic excavator according to the second embodiment configured thus, the inverter 22 for controlling the slew assist electric motor 21 is disposed in a position near the first vertical rib 1a (i.e. close to the slew assist electric motor 21) in the second tool chamber 13 which is located in the first side region L. That is, in the same manner as in the first embodiment, the inverter 22 is disposed near the slew assist electric motor 21. Accordingly, the length of the high-tension cable 25 connecting the inverter 22 with the slew assist electric motor 21 can be set to be short. It is therefore possible to obtain operation and effect equivalent to those in the first embodiment.

In addition, in the hydraulic excavator according to the second embodiment, the length of the control signal line 23 connecting the vehicle body controller 16 with the inverter 22 can be set to be comparatively short. Accordingly, it is possible to reduce the probability that the control signal line 23 may receive noise from the slew assist electric motor 21 and the high-tension cable 25. Thus, it is possible to obtain a hydraulic excavator which is superior in the control accuracy of the slew assist electric motor 21.

Figure 5:
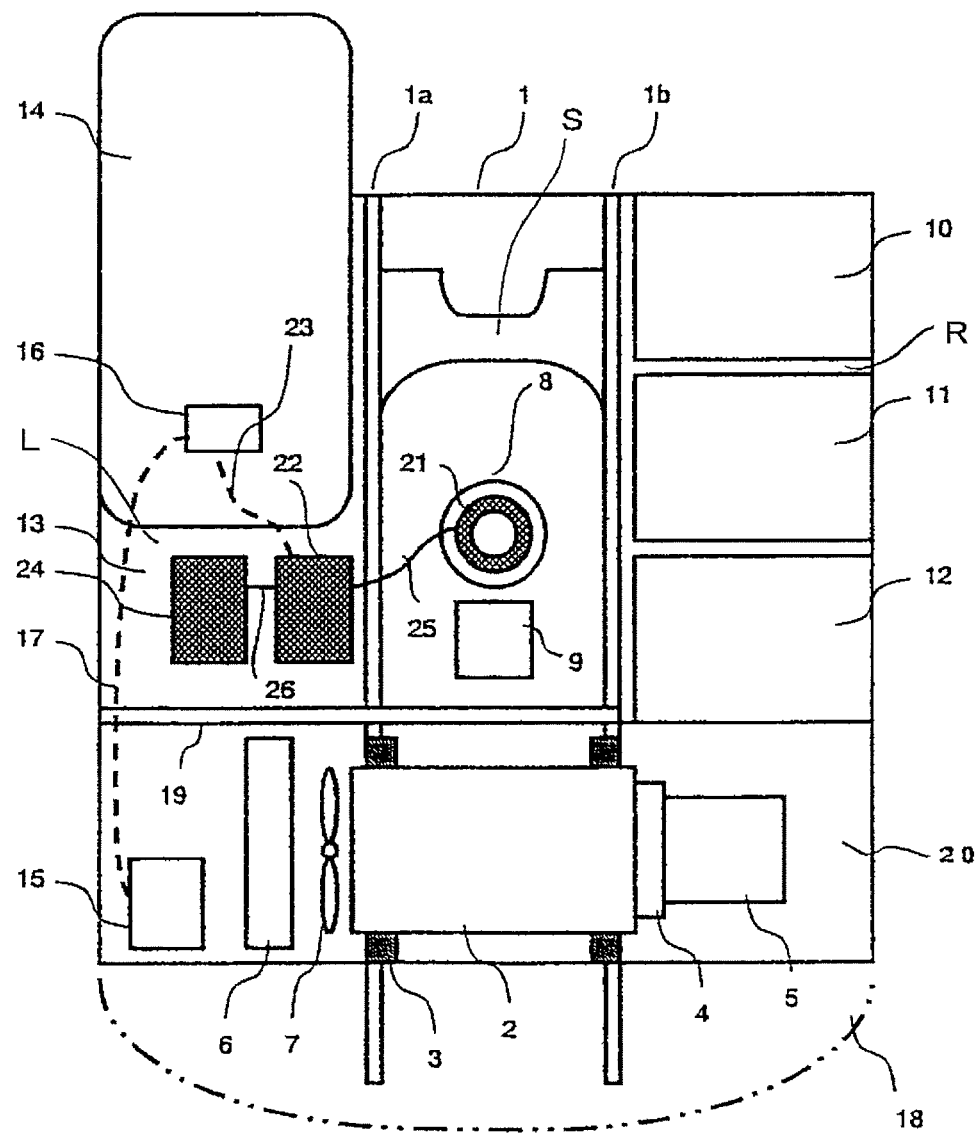
FIG. 5 A plan view showing the layout of devices on an upper structure provided in a third embodiment of the invention.

FIG. 5 is a plan view showing the layout of devices on an upper structure provided in a third embodiment of the invention. An electric work vehicle provided in the third embodiment may be also, for example, a hydraulic excavator equivalent to the crawler type hydraulic excavator shown in FIG. 1.

In the hydraulic excavator according to the third embodiment shown in FIG. 5, an electric storage device 24 for supplying driving power to the inverter 22 is disposed in the region where the inverter 22 is disposed. That is, the inverter 22 is disposed near the first vertical rib 1a in the second tool chamber 13 provided in the first side region L, while the electric storage device 24 is disposed in the second tool chamber 13 provided in the first side region L so as to extend in parallel with the inverter 22. The electric storage device 24 and the inverter 22 are connected with each other by a high-tension cable 26. The other configuration is equivalent to that in the aforementioned hydraulic excavator according to the second embodiment.

According to the hydraulic excavator according to the third embodiment configured thus, operation and effect equivalent to those in the second embodiment can be obtained, and the high-tension cable 26 connecting the inverter 22 with the electric storage device 24 can be prevented from approaching or crossing control signal lines connected to various sensors and so on disposed on the main frame 1. Accordingly, it is possible to reduce the probability that the control signal lines may receive noise from the high-tension cable 26 connecting the inverter 22 with the electric storage device 24. In this manner, it is possible to obtain a hydraulic excavator which is superior in the accuracy of various controls performed by the vehicle body controller 16. Further, since the length of the high-tension cable 26 connecting the inverter 22 with the electric storage device 24 can be set to be comparatively short, it is possible to reduce the cost of the high-tension cable 26. Thus, it is possible to reduce the manufacturing cost of the hydraulic excavator.

Figure 6:
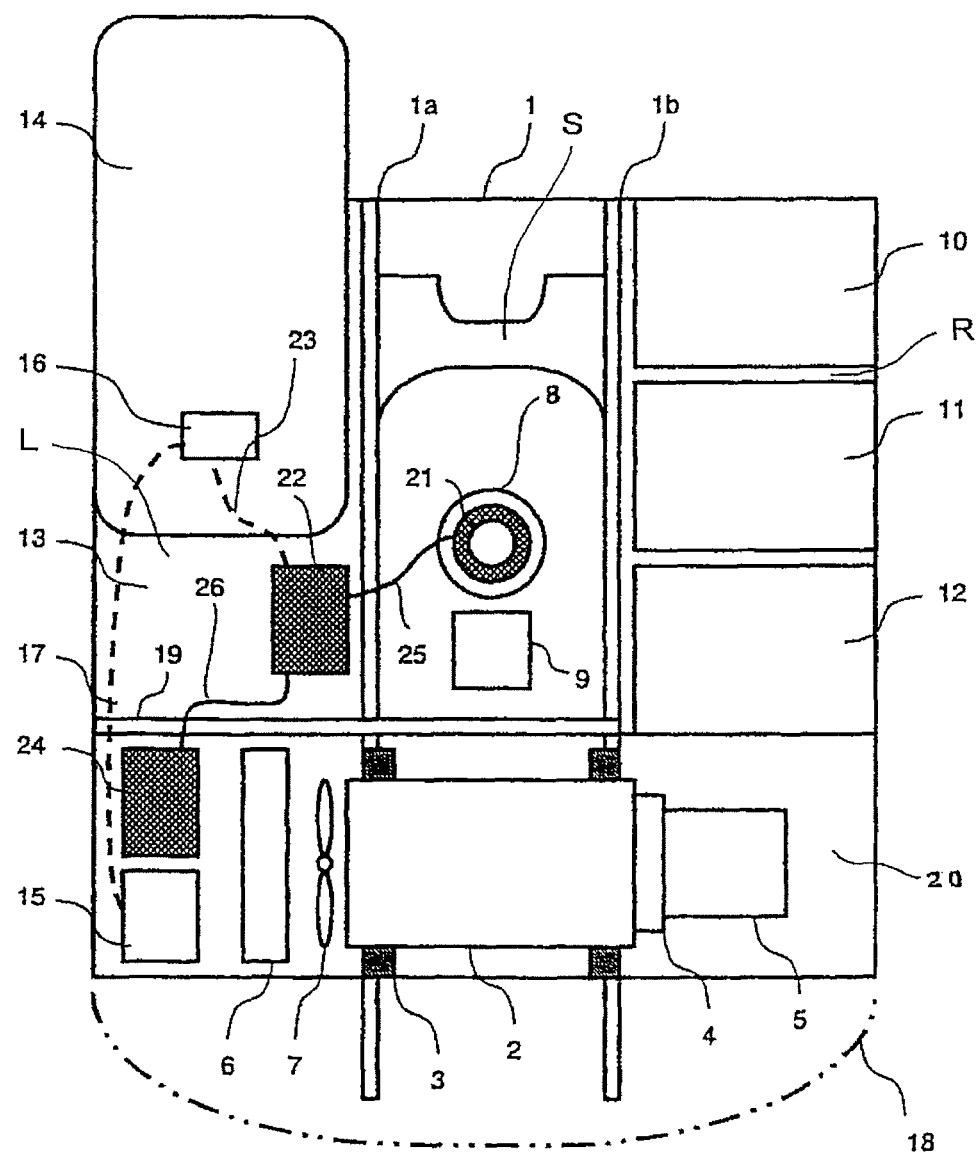
FIG. 6 A plan view showing the layout of devices on an upper structure provided in a fourth embodiment of the invention.

FIG. 6 is a plan view showing the layout of devices on an upper structure provided in a fourth embodiment of the invention. An electric work vehicle provided in the fourth embodiment may be also, for example, a hydraulic excavator equivalent to the crawler type hydraulic excavator shown in FIG. 1.

In the hydraulic excavator according to the fourth embodiment shown in FIG. 6, the electric storage device 24 for supplying driving power to the inverter 22 is provided in the engine room 20. That is, the electric storage device 24 for supplying driving power to the inverter 22 is disposed in an upstream position of the cooling unit 6 with respect to the flow of intake air introduced into the engine room 20 so that the electric storage device 24 extends in parallel with the electric storage device 15 for supplying electric power for activating the vehicle body controller 16. The other configuration is equivalent to that in the aforementioned hydraulic excavator in the second embodiment.

According to the hydraulic excavator according to the fourth embodiment configured thus, it is possible to obtain operation and effect equivalent to those in the second embodiment. In addition, since the electric storage device 24 is disposed on the most upstream side of the flow of the intake air introduced into the engine room 20, the electric storage device 24 can be kept at a comparatively low temperature. Thus, it is possible to prevent the electric storage device 24 from deteriorating in performance and from malfunctioning so that it is possible to secure the stable driving performance of the slew assist electric motor 21 driven by the electric power supplied from the electric storage device 24.

Although a crawler type hydraulic excavator has been described as an electric work vehicle in each of the aforementioned embodiments, the invention is not limited to such a crawler type hydraulic excavator but may be applied to a wheel type hydraulic excavator or to a work machine such as a crane.

Although the slewing motor is constituted by the slewing hydraulic motor 8 and the slew assist electric motor 21 in each of the aforementioned embodiments, the slewing motor may be constituted by only a slewing electric motor.

REFERENCE SIGNS LIST 1 main frame
1a first vertical rib
1b second vertical rib
2 engine
5 hydraulic pump
6 cooling unit
8 slewing hydraulic motor
13 second tool chamber
14 operator's cab
16 vehicle body controller
18 counter weight
20 engine room
21 slew assist electric motor
22 inverter
23 control signal line
24 electric storage device
25 high-tension cable
26 high-tension cable
31 undercarriage
32 upper structure
33 work device
L first side region
R second side region
S center region

The invention claimed is:
1. An electric work vehicle comprising:
an upper structure;
a work device which is attached to the upper structure; a counter weight which is disposed at the rear of the upper structure;
an engine room which is disposed in front of the counter weight;
a first vertical rib and a second vertical rib which are provided on the main frame so as to extend in parallel with each other in a front/rear direction so that a region on the main frame is divided into three regions consisting of a center region which is formed between the first vertical rib and the second vertical rib, a first side region which is located on an opposite side to the second vertical rib with interposition of the first vertical rib, and a second side region which is located on an opposite side to the first vertical rib with interposition of the second vertical rib;
a slewing motor which slews the upper structure, which is disposed in the center region of the three regions on the main frame and which includes an electric motor; and
an inverter for controlling the electric motor; characterized in that:
the inverter is disposed on the main frame and in front of the engine room so as to be located in the first side region or the second side region and near the electric motor included in the slewing motor.
2. A electric work vehicle according to claim 1, wherein:
the slewing motor includes a slewing hydraulic motor and a slew assist electric motor provided additionally to the slewing hydraulic motor, and the electric motor included in the slewing motor is the slew assist electric motor.
3. An electric work vehicle according to claim 1 wherein:
the electric work vehicle comprises: a vehicle body controller which is disposed in the first side region or the second side region and which controls slewing of the upper structure, running of the undercarriage and driving of the work device, and the inverter is disposed in the region where the vehicle body controller is provided.
4. An electric work vehicle according to claim 3, wherein:
an operator's cab is provided in the upper structure and in front of the engine room, and the vehicle body controller is disposed in the operator's cab.
5. An electric work vehicle according to claim 1 wherein:
an electric storage device which supplies driving power to the inverter is disposed in the region where the inverter is disposed.
6. An electric work vehicle according to claim 1 wherein:
a cooling unit which includes a plurality of heat exchangers is provided in the engine room, and an electric storage device which supplies driving power to the inverter is disposed in the engine room and in an upstream position of the cooling unit with respect to a flow of intake air introduced into the engine room.
7. An electric work vehicle according to claim 2, wherein:
the electric work vehicle comprises: a vehicle body controller which is disposed in the first side region or the second side region and which controls slewing of the upper structure, running of the undercarriage and driving of the work device, and the inverter is disposed in the region where the vehicle body controller is provided.
8. An electric work vehicle according to claim 7, wherein:
an operator's cab is provided in the upper structure and in front of the engine room, and the vehicle body controller is disposed in the operator's cab.

9. An electric work vehicle according to claim 2, wherein:
an electric storage device which supplies driving power to the inverter is disposed in the region where the inverter is disposed.

10. An electric work vehicle according to claim 2, wherein:
a cooling unit which includes a plurality of heat exchangers is provided in the engine room, and an electric storage device which supplies driving power to the inverter is disposed in the engine room and in an upstream position of the cooling unit with respect to a flow of intake air introduced into the engine room.

* * * * *